Figure 1:
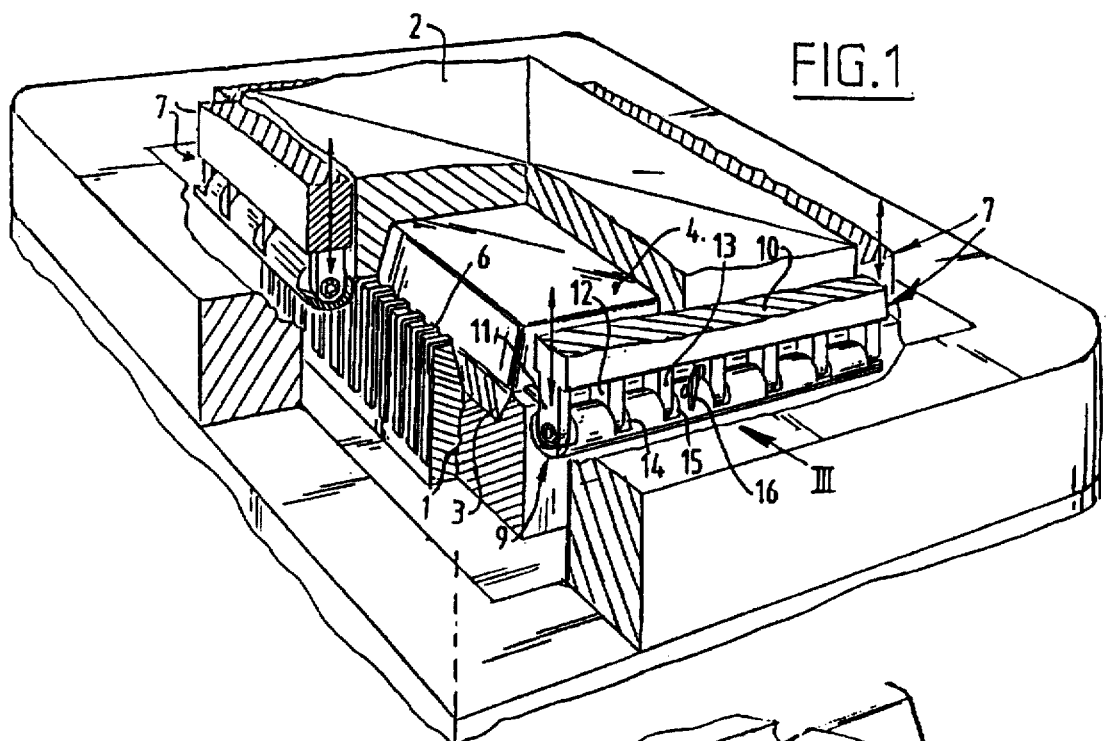

United States Patent [19]

Adrianus

[11] Patent Number: 5,626,169
[45] Date of Patent: May 6, 1997

[54] DEVICE FOR BENDING LEADS OF A LEAD FRAME

[75] Inventor: Van Dalen W. Adrianus, Nijmegen, Netherlands

[73] Assignee: FICO B.V., Netherlands

[21] Appl. No.: 428,090

[22] PCT Filed: Mar. 31, 1993

[86] PCT No.: PCT/EP93/03043

§ 371 Date: Jul. 25, 1995

§ 102(e) Date: Jul. 25, 1995

[87] PCT Pub. No.: WO94/12009

PCT Pub. Date: May 26, 1994

[30] Foreign Application Priority Data

Nov. 6, 1992 [NL] Netherlands ............... 9201950

[51] Int. Cl.[6] ............................................. B21F 1/00
[52] U.S. Cl. ............................................. 140/105
[58] Field of Search ............... 140/105; 72/190, 72/189, 220, 212, 213; 492/16, 39

[56] References Cited

U.S. PATENT DOCUMENTS

| 3,416,348 | 12/1968 | Carter, Jr. et al. | 72/220 |
| 5,135,034 | 8/1992 | Miyamoto | 140/105 |

FOREIGN PATENT DOCUMENTS

| 1-278917 | 11/1989 | Japan | 140/105 |
| 2247424 | 3/1992 | United Kingdom | H05K 13/02 |

*Primary Examiner*—Lowell A. Larson
*Attorney, Agent, or Firm*—Limbach & Limbach LLP

[57] ABSTRACT

The leads of a lead frame on which an encapsulated chip is placed are bent by placing them in a mould and subsequently bending them with a bending tool in the form of a cylinder-like roller rotatable round a rotating shaft. Because the roller rolls off over the leads, scraping off of solder onto the leads is prevented during bending. In view of its length the mounting of such a roller causes problems, such as sagging. This is resolved according to the invention by providing the roller on the periphery with slot-like recesses for passage of a bearing for the rotating shaft.

6 Claims, 1 Drawing Sheet

U.S. Patent    May 6, 1997    5,626,169

DEVICE FOR BENDING LEADS OF A LEAD FRAME

In the production of integrated circuits chips are placed on a lead frame and the connecting points of the ICs are fixed to the lead frames. For further use the leads have to be bent in order to be able to place them for instance on a printed circuit board. The operations which therefore have to be performed on the lead frames include cutting the leads to the correct length and the bending thereof. The leads are bent through approximately a right angle. Present on the lead frame is a layer of solder which can adhere to the machining tools. This has drawbacks. The adhering of solder to the tools is the result of a sliding or scraping movement which the bending tool makes over the surface of the leads during bending. In order to obviate this drawback bending tools are embodied with rotatable rollers. Thus is achieved that during bending no movement takes place between the roller-like bending tool and the relevant lead. There is therefore no scraping or abrading action involved.

From GB-A-2.247.424 a device as described in the preamble of claim 1 is known.

The known rolling bending tools are mounted on the outer ends of the rotating shaft in the driving member of the tool.

Due to the mounting on the outer ends of the rotating shaft no further support of the roller takes place so that there is the danger that the roller can sag or that the suspension points break, particularly in the case of a large span. Shape and dimension variations are the result.

Because mounting takes place on the outer side outside the roller a greater length is required than corresponds with the total width of a side of the frame. This can bring about drawbacks under certain conditions.

The invention has for its object to provide a solution to this problem. This is achieved according to the invention by the features as described in the characterizing part of claim 1.

By mounting the bending tool in the form of the roller at points between the extremities of the roller support is obtained along the whole length of the roller so that the danger of sagging and breakage is obviated. Further, the total length of the tool, that is, of the rotating shaft, is not greater than the total width of one side of the lead frame for machining. While it is the case that because of the slot-like recesses only a portion of the periphery of the roller performs the bending function, this is sufficient for the bending through 90°.

In order to ensure that only the uninterrupted surface of the roller comes into contact with the leads the roller is carried under a rotational bias to a starting position. This bias can be produced by compressed air.

The invention will be further elucidated with reference to the drawings.

Figure 2:
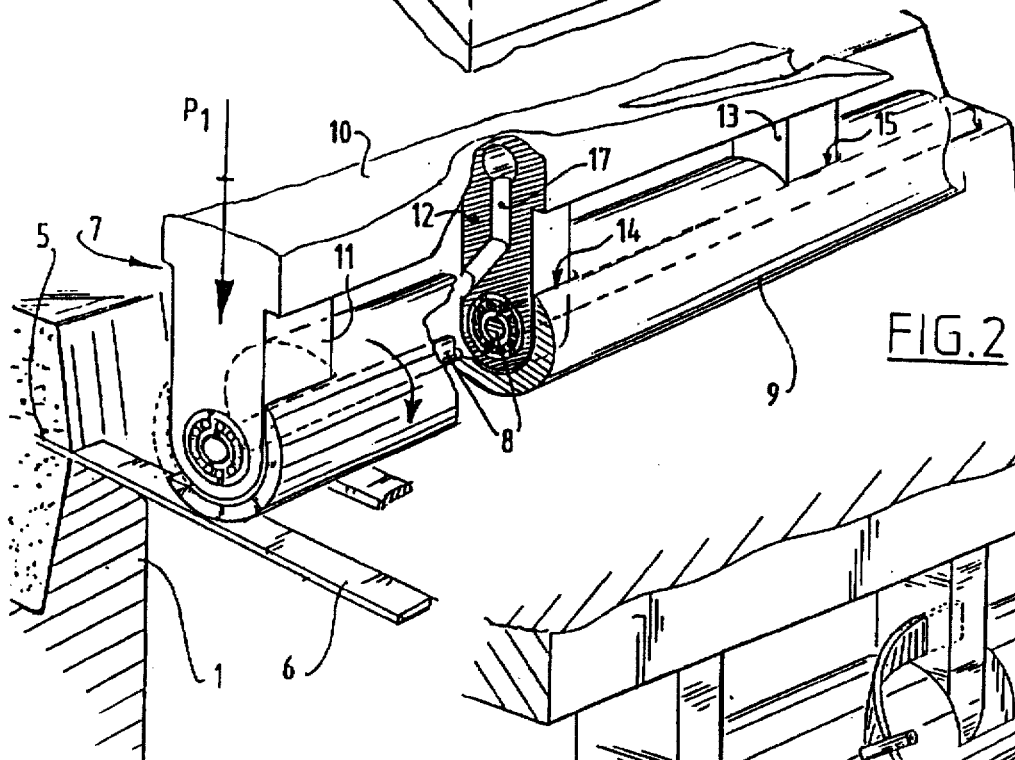
Figure 3:
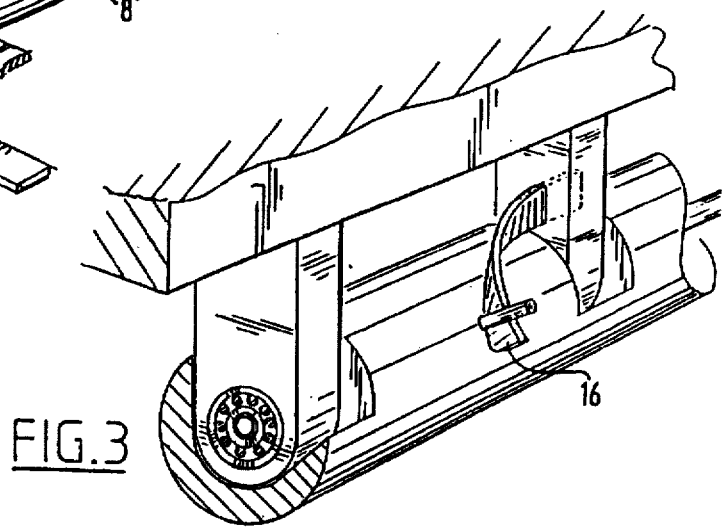

FIG. 1 shows in perspective view with broken away parts the device according to the invention, and FIG. 2 shows on a larger scale the bending tool according to the invention, and FIG. 3 shows on a larger scale a detail of FIG. 1 as according to arrow 3.

The device according to the invention comprises a mould half 1 and a mould half 2. Both mould halves are movable relative to one another. In the closed position a space 3 is left free for receiving a lead frame 4 on which a chip is mounted. In this position the leads 5, . . . of the frame are supported on the edges of the mould and therein protrude with their free ends 6. The bending tool 7 consists of a roller 9 rotatable round a shaft 8. The roller is mounted a movable (P1) carrier 10. Carrier 10 has a number of parallel extending arms 11, 12, 13, . . . which extend through respective recesses 14, 15 and engage onto the rotating shaft 8 for instance via a needle bearing.

In FIG. 2 the bending tool 7 is situated in the starting position. The leads are bent by the movement of the bending tool 7, wherein the roller 9 rolls off along the leads and therefore no movement of the tool relative to the surface of the leads occurs (FIG. 1). Since only a limited portion of the periphery of the roller can perform the intended function, biasing means have to be provided so that in the starting position the roller always assumes an angular position such that during the bending movement the part of the periphery not interrupted by the recesses 14, 15, . . . comes into contact with the leads.

These biasing means can be formed for instance by the leaf spring 16 FIG. 3 or a channel 17 for connection to a source of compressed air.

I claim:

1. A device for bending leads of a lead frame comprising:

two mould halves which are movable relative to each other and which are movable between an open position and a closed position leaving free a space for receiving the lead frame, wherein the leads are supported on edges of the mould halves; and a movable bending tool in the form of a cylinder-like roller is rotatably mounted on a rotating shaft and said roller having at least one slot-like recess between first and second ends of the roller, for passage of a bearing for the rotating shaft.

2. The device as claimed in claim 1, wherein the rotational movement of the roller is limited to a desired angle.

3. The device as claimed in claim 2, wherein the rotational movement of the roller is limited to an angle of about 90°.

4. The device as claimed in claim 1, further including means for biasing the roller toward a roller starting position.

5. The device of claim 4 wherein said means comprises a leaf spring.

6. The device of claim 4 wherein said means comprises a channel for permitting the passage of compressed air.

* * * * *

UNITED STATES PATENT AND TRADEMARK OFFICE
CERTIFICATE OF CORRECTION

PATENT NO.   : 5,626,169
DATED        : May 6, 1997
INVENTOR(S)  : Adrianus W. Van Dalen It is certified that error appears in the above-indentified patent and that said Letters Patent is hereby corrected as shown below:

On the title page, items [19] should read -- Van Dalen -- and [75] should read -- Adrianus Wilhelmus Van Dalen --

Column 2, line 29, delete " FIG. 3" and replace with -- (FIG. 3)--.

Signed and Sealed this

Sixteenth Day of September, 1997

Attest:

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,626,169
DATED : May 6, 1997
INVENTOR(S) : ADRIANUS WILHELMUS VAN DALEN

It is certified that error appears in the above-identified patent and that said Letters Patent is hereby corrected as shown below:

On the title page at the PCT Filed:, please delete "Mar. 31, 1993" and replace with -- Nov. 1, 1993--.

Signed and Sealed this

Seventh Day of April, 1998

Attest:

BRUCE LEHMAN

*Attesting Officer*     *Commissioner of Patents and Trademarks*